(12) United States Patent
Gambetta et al.

(10) Patent No.: US 9,111,230 B2
(45) Date of Patent: Aug. 18, 2015

(54) FREQUENCY ARRANGEMENT FOR SURFACE CODE ON A SUPERCONDUCTING LATTICE

(71) Applicant: International Business Machines Corporation, Armonk, NY (US)

(72) Inventors: Jay M. Gambetta, Yorktown Heights, NY (US); John Smolin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 13/827,326

(22) Filed: Mar. 14, 2013

(65) Prior Publication Data

US 2014/0264283 A1  Sep. 18, 2014

(51) Int. Cl.
*G06N 99/00* (2010.01)
*B82Y 10/00* (2011.01)

(52) U.S. Cl.
CPC .............. *G06N 99/002* (2013.01); *B82Y 10/00* (2013.01)

(58) Field of Classification Search
CPC  G06N 99/002; H04L 9/0852; H04L 2209/34; B82Y 10/00; Y10S 977/933; Y10S 438/962; G06F 11/1008; G06F 7/72; H03M 13/00; H03M 13/03

USPC .............................. 257/E21.002, E39.014, 31
See application file for complete search history.

(56) References Cited

U.S. PATENT DOCUMENTS

| | | | |
|---|---|---|---|
| 5,768,297 A * | 6/1998 | Shor | 714/763 |
| 7,015,499 B1 | 3/2006 | Zagoskin | |
| 7,018,852 B2 * | 3/2006 | Wu et al. | 438/2 |
| 7,277,872 B2 * | 10/2007 | Raussendorf et al. | 706/14 |
| 7,418,283 B2 | 8/2008 | Amin | |
| 7,529,717 B2 | 5/2009 | Vala et al. | |
| RE41,900 E | 10/2010 | Tucci | |
| 8,032,474 B2 * | 10/2011 | Macready et al. | 706/46 |
| 2003/0005010 A1 * | 1/2003 | Cleve et al. | 708/403 |
| 2009/0321720 A1 * | 12/2009 | Rose | 257/31 |
| 2011/0060711 A1 * | 3/2011 | Macready et al. | 706/46 |
| 2012/0265718 A1 | 10/2012 | Amin et al. | |
| 2013/0246495 A1 * | 9/2013 | Svore et al. | 708/491 |

* cited by examiner

*Primary Examiner* — Stephen W Smoot
*Assistant Examiner* — Edward Chin
(74) *Attorney, Agent, or Firm* — Cantor Colburn LLP; Vazken Alexanian

(57) ABSTRACT

A device lattice arrangement including a plurality of devices, a plurality of physical connections for the plurality of devices, wherein each of the plurality of devices are coupled to at least two of the plurality of physical connections, a plurality of identity labels associated with individual devices of the plurality of devices and an arrangement of identity labels such that pairs of devices of the plurality of devices connected by some number of the plurality of connections have different identity labels.

25 Claims, 7 Drawing Sheets

US 9,111,230 B2

FREQUENCY ARRANGEMENT FOR SURFACE CODE ON A SUPERCONDUCTING LATTICE

STATEMENT OF GOVERNMENT INTEREST

This invention was made with Government support under Contract No.: W911NF-10-1-0324 awarded by Army Research Office (ARO). The Government has certain rights in this invention.

BACKGROUND

The present invention relates to quantum information processing, and more specifically, to systems and methods for a frequency arrangements for implementation of surface code on superconducting lattices.

Quantum information processing holds potential for solving certain categories of mathematical problems that are intractable with conventional machine computation. Building a useful quantum computer requires the implementation of a quantum error correcting code on a system consisting of several million physical qubits. Recently, the surface code has emerged as an architecture for a quantum computer due to its high tolerance to errors on the physical qubits. The surface code has a fault-tolerant threshold of about 1%. In this architecture each physical qubit is coupled to it nearest neighbor forming a two dimensional grid with half the qubits being used to store the quantum information and the other half being used for the error correction.

Superconducting qubits have made considerable progress recently in experimental demonstration of the requirements for implementing a surface code quantum computer. Recently single and two qubit gates have been shown to have gate errors approaching the fault-tolerant threshold and high-fidelity measurements are becoming feasible.

SUMMARY

Exemplary embodiments include a device lattice arrangement, including a plurality of devices, a plurality of physical connections for the plurality of devices, wherein each of the plurality of devices are coupled to at least two of the plurality of physical connections, a plurality of identity labels associated with individual devices of the plurality of devices and an arrangement of identity labels such that pairs of devices of the plurality of devices connected by some number of the plurality of connections have different identity labels.

Further exemplary embodiments include a superconducting qubit surface code system, including a first plurality of superconducting qubits, a second plurality of superconducting qubits and a plurality of resonators coupling the first and second plurality of superconducting qubits, wherein the each of the plurality of first and second plurality of superconducting qubits includes an identity label.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
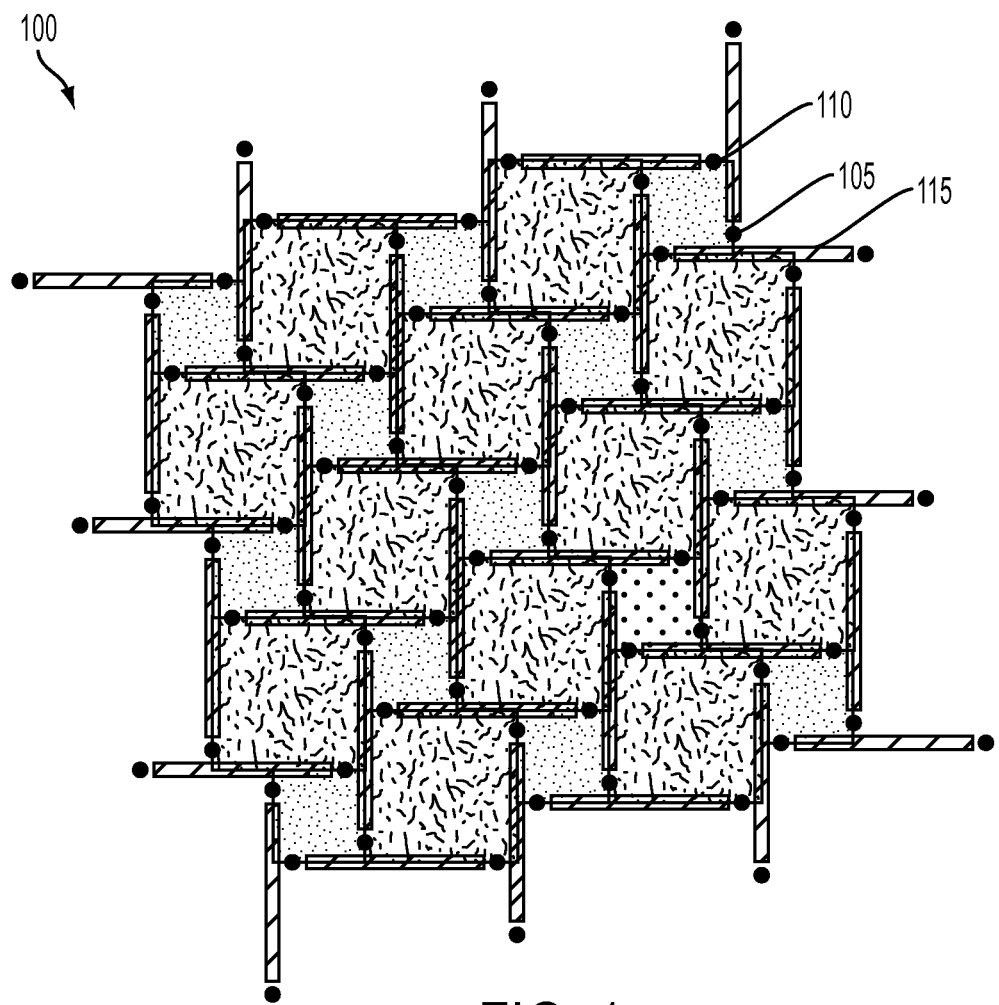
FIG. 1 illustrates an example of a skew-square lattice arrangement.

In exemplary embodiments, the systems and methods described herein arrange a lattice of superconducting qubits on a skew symmetric lattice so that a universal quantum computer with the surface code can be implemented. In this way a reduced number of identifiers is realized (i.e., about five identifiers). To realize a surface code with superconducting qubits, a "skew-square" (or Pythagorean) lattice of resonators can be implemented as in FIG. 1, which illustrates a skew square lattice arrangement 100. Each qubit 105 is coupled to two physical connections (e.g., resonators 110, 115). The resonators 110, 115 can be resonant cavities in the case of superconducting qubit technology. The skew-square lattice arrangement 100 has the benefit in that a single qubit only couples to at most two resonators. For example, as shown in FIG. 1, one qubit 105 couples to two resonators 110, 115. In exemplary embodiments, the systems and methods described herein implement a surface code mapping with fewer "ancilla" qubits than previously implemented (i.e., one ancilla qubit per data qubit) and show that with this arrangement fewer different unique labels are implemented (e.g., up to about nine different unique labels). The systems and methods described herein implement arrangements for the surface code and include respective frequencies.

In exemplary embodiments, the systems and methods described herein arrange superconducting qubits for the implementation of a universal quantum computer using the surface code on a skew symmetric lattice. For a surface code quantum computer, each data qubit is controllably coupled to its four neighboring ancilla qubits in order to perform a series of four controlled NOT (CNOT) gates which implement a step in the error correction procedure.

The surface code is a two-dimensional grid with each qubit coupling to its four neighbors and so on. In order to implement the surface code, controllers for surface code systems address two qubits at once and perform a two-qubit entangling gate (for example the CNOT gate). On this two-dimensional grid, at least at least five different unique labels are required for the CNOT gates to be realized without cross-talk. For example, with superconducting qubits, the unique labels can be realized with different frequencies or tunable interactions. In superconducting qubits the interactions between the qubits are generally performed by a quantum bus (e.g., a co-planner resonator or 3D waveguide cavity). By implementing a quantum bus, physical design can be realized in which every qubit is only coupled to at most two quantum buses. It has been shown that the surface code could be implemented on a skew symmetric lattice with many of the qubits acting only as ancilla qubits to simulate the effect of the fourfold connectivity implemented by the surface code.

Figure 2:
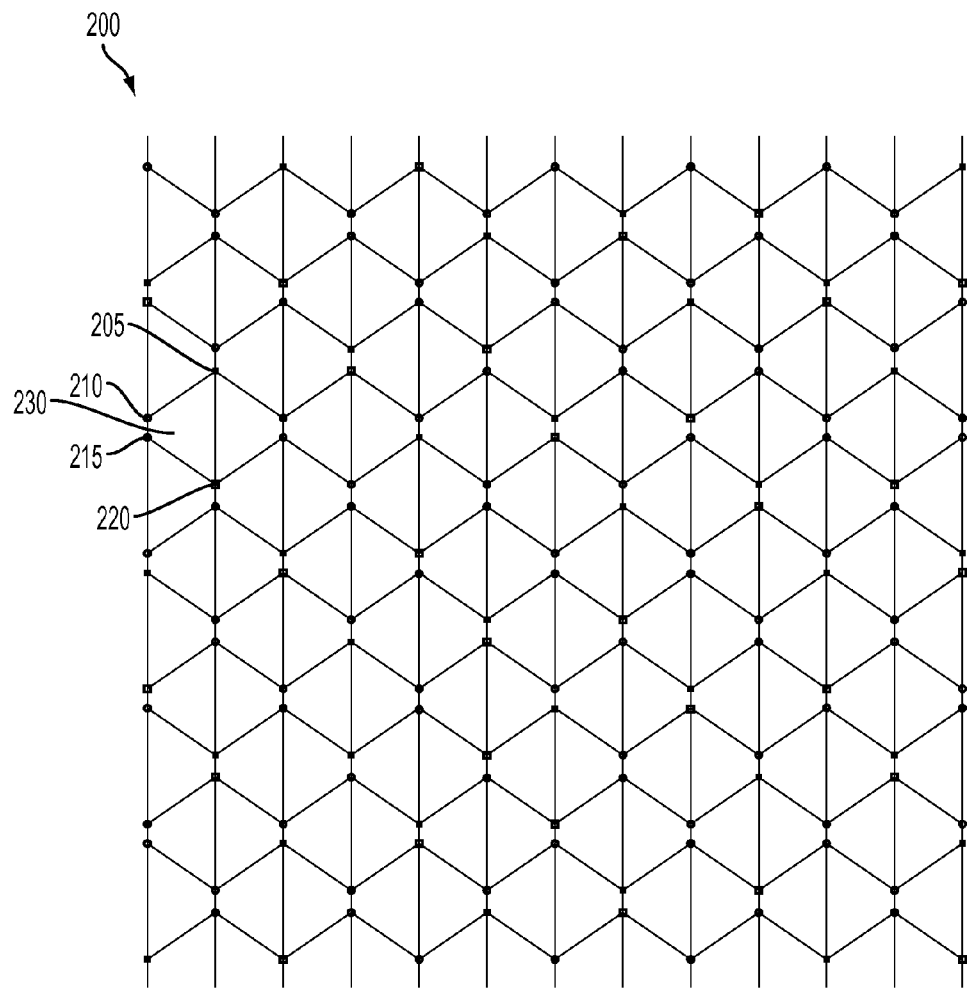
FIG. 2 illustrates an example a distorted square lattice representing the lattice for a surface code.

In exemplary embodiments, the systems and methods described herein implement a surface code in which the lattice can be modified to reduce the number of identifiers and labels, while maintaining the advantages of the known surface code. The systems and methods described herein enable an efficient mapping of the surface code onto the "snub-square" lattice. As such, half the qubits are implemented as data qubits and half the qubits are implemented as measurement "ancillas." One mapping has been shown to achieve only ⅕ of the qubits for data. FIG. 2 illustrates a surface code lattice mapping 200, which is a simple square lattice of data qubits that has been deformed into a tiling of trapezoids. The example in FIG. 2 is a distorted square lattice representing the lattice for the surface code. In the example, the qubits 205, 210, 215, 220 are spread out on the intersections of lattice points. Surface code measurements can be thought of as taking place in a middle point 230 of the resulting trapezoid shapes, measuring the X or Z parity of the four surrounding qubits 205, 210, 215, 220.

Figure 3:
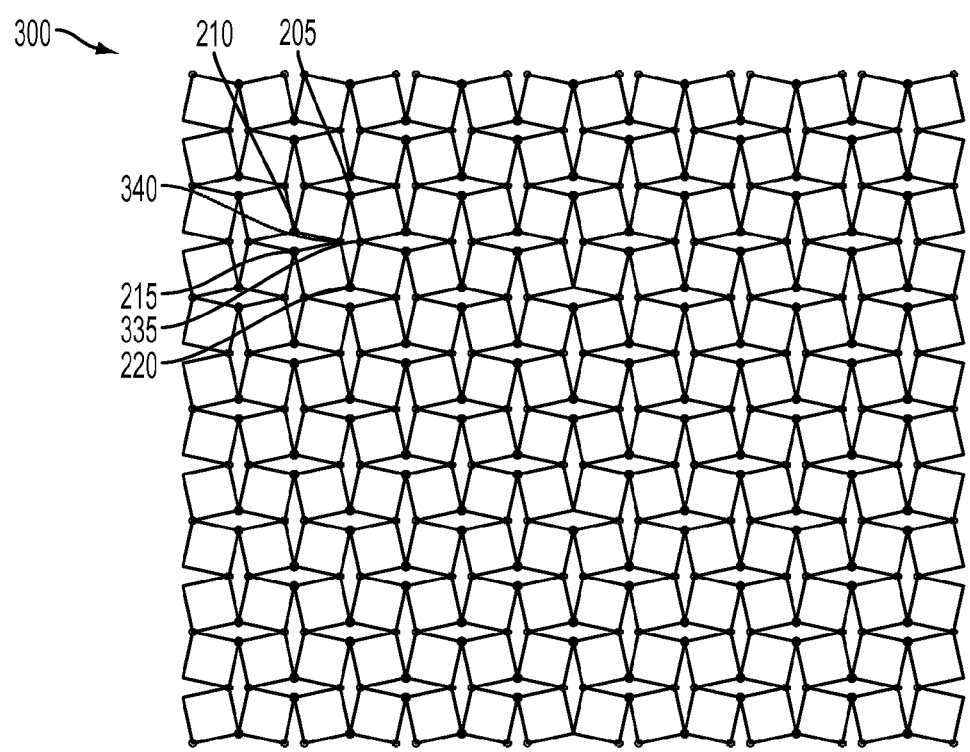
FIG. 3 illustrates an example of a snub-square lattice.

The ancillas/measurements are done on the interior of each resulting trapezoid shape defined by the qubits 205, 210, 215, 220. FIG. 3 illustrates an example of a "snub-square" lattice arrangement 300. For illustrative purposes, the same four qubits as in FIG. 2 are illustrated. Resulting trapezoid shapes are no longer shown. Instead, ancilla qubits 335, 340 are shown. The ancilla qubit 340 is connected to the four data qubits 205, 210, 215, 220 whose parity the ancilla qubit, 340 measures. Similarly, ancilla qubit 335 measures the parities of the qubits on the vertices of next trapezoid to the right, consisting of qubits 205, 220 and two more not labeled here. Each of the ancilla qubits 335 measure X parities, and each of the ancilla qubits e 340 measure Z parities, or vice versa.

Figure 4:
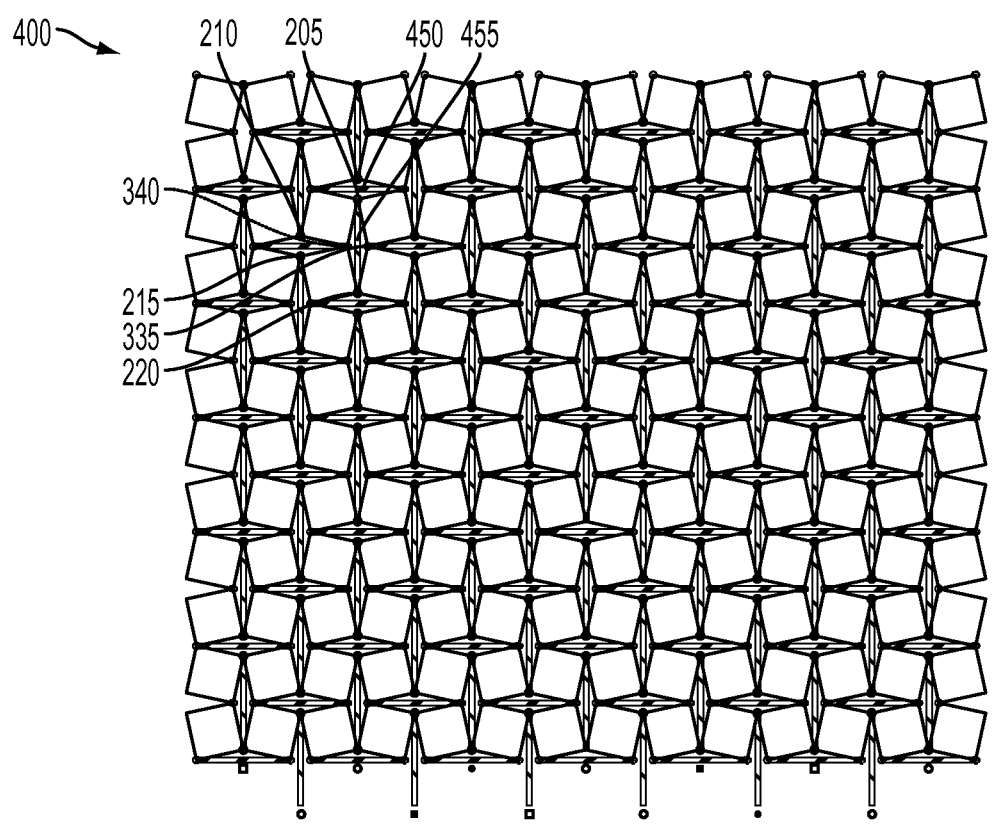
FIG. 4 illustrates an example of a full lattice arrangement.

FIG. 4 illustrates an example of a full lattice arrangement 400. For illustrative purposes, each of the data qubits 205, 210, 215, 220 and each ancilla qubit 335, 340 are shown. In addition, physical connections 450, 455 (e.g., resonators) are shown. Each qubit 205, 210, 215, 220, 335, 340 is coupled to the closest two physical connections 450, 455. Connectivity though the physical connections 450, 455 can implement all the required measurement connections of the overlaid snub-square lattice.

As such, the layout of the physical connections 450, 455 and qubits 205, 210, 215, 220, 335, 340 in the example in FIG. 4, includes the connectivity of the snub-square lattice 300 of FIG. 3. The layout has each qubit connected to only two physical connections. The layout 400 is a lattice with the p4g wallpaper group symmetry. A wallpaper group (or plane symmetry group or plane crystallographic group) is a mathematical classification of a two-dimensional repetitive pattern, based on the symmetries in the pattern.

Figure 5:
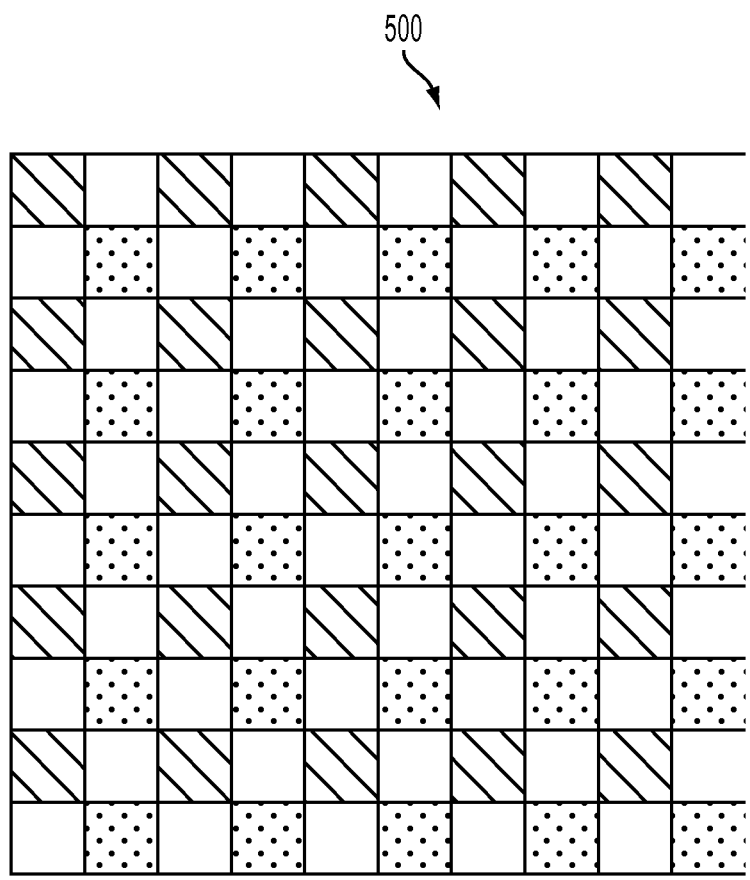
FIG. 5 illustrates an example of a connection-wise equivalent of the lattice of FIG. 4.

FIG. 5 illustrates connection-wise equivalent layout 500 to that of FIG. 4. The various snub-squares have been stretched into squares, and the resonators have been expanded to fill their squares, representing the fact that they couple to all surrounding qubits. The qubits (not shown) are at the corners of each square, data qubits spread out on various alternating squares, and the remaining corners are the ancilla/measurement qubits.

The layout 400 can optionally be deformed into the existing skew-square layout without changing its basic connectivity properties. The skew-square layout has the additional advantage that the physical distance between qubits directly across a physical connection can be increased.

In exemplary embodiments, there are many possible combinations of layouts of the previous figures (depending on various constraints explained below) of the layout such that each qubit has an "identity label" that differs from every other qubit to which it may need to be connected by a CNOT in carrying out the surface code. Additionally, these other qubits also have different labels than one another, which allow addressability of both qubits involved in a CNOT, while isolating them from other qubits. This labeling scheme is general enough to support various gate control schemes, as well as gates other than the CNOT. Because the physical connections in our layout connect some qubits which need not be connected in the surface code (see FIG. 4), the exemplary embodiments described herein have that the qubits connected by physical connections also have distinct labels. FIG. 5 shows how the snub-square lattice can be stretched into a traditional square lattice. The squares are stretched versions of the resonators from FIG. 4. Data qubits are located at the upper-right and lower-left corners of a first set of alternating squares and ancilla qubits are located at the remaining corners (the qubits are not shown). The lattice could be physically arranged this way as well, but the example in FIG. 5 illustrates the isomorphism to the simple square arrangement of the surface code. The labels can then be written down as simple tables of numbers, corresponding to the grid points in FIG. 5.

In exemplary embodiments, the systems and methods described herein can arrange the surface code connections to be addressable as above as described in the previous example, having five labels. In this way, each row repeats the pattern 123451234512345, and each consecutive row shifts the starting number by 2. In other exemplary embodiments, if the data qubits 205, 210, 215 are to have different labels from the ancilla qubits 335, 340 then eight labels can be implemented. The first row has the pattern 1A2B1A2B1A2B, the next row is C3D4C3D4C3D4, the next is 2B1A2B1A2B1A (the first row shifted by two places), the next row is D4C3D4C3D4C3 (the second row shifted by two places) and then the pattern repeats. Numbers correspond to data qubits and letters to ancilla qubits. In further exemplary embodiments, if isolation and addressability is implemented, such that every qubit connected through two physical connections has a distinct label, then nine labels can be implemented. In exemplary embodiments, the pattern 123456789123456789 is implemented on the first row, then shifted by three on the next row, and so on, which allows for every qubit to have the addressability to have two-qubit gates performed between it and every qubit to which is connected by a physical connection.

Figure 6:
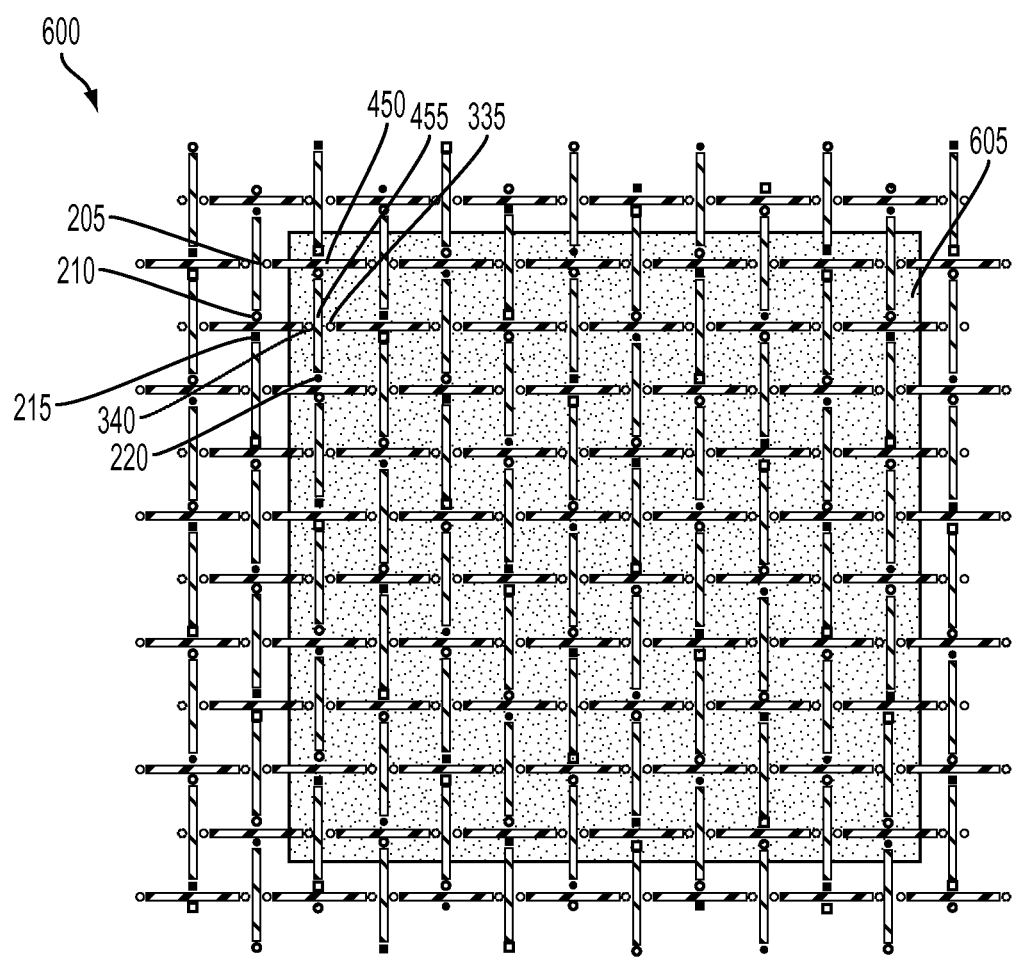
FIG. 6 illustrates an example of a physical lattice of qubits and physical connections.
Figure 7:
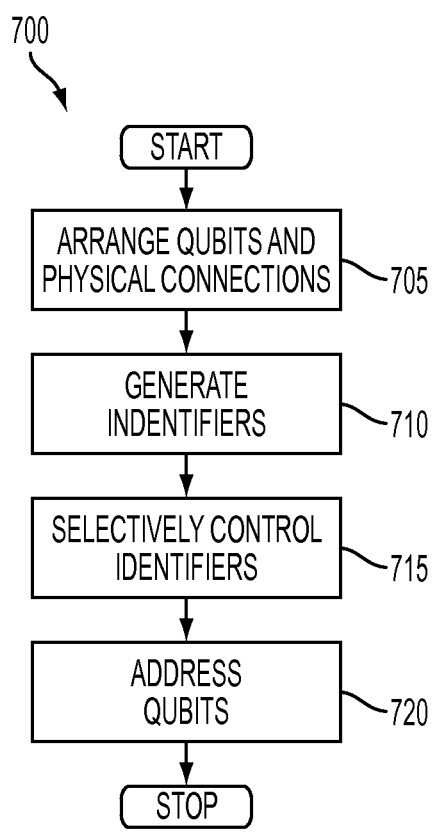
FIG. 7 illustrates a flowchart of a method for arranging a lattice of superconducting qubits in accordance with exemplary embodiments.

In exemplary embodiments, another implementation of nine labels is illustrated in FIG. 6. FIG. 6 illustrates a physical lattice of qubits 205, 210, 215, 220, 335, 340 and physical connections 450, 455 as in FIG. 4, but with the snub square overly removed for clarity. In the example of FIG. 6, there are nine different types of qubits, noting that there are different shapes to the data qubits 205, 210, 215, 220. The red and green qubits are the ancillas, while the blue qubits are the data. The large shaded square 605 shows the extent of a unit cell of the lattice (the area after which it repeats).

In the example, the data qubits 205, 210, 215, 220 and the ancilla qubits 335, 340 have different labels, and enough addressability so that every data qubit can have two-qubit gates applied between it and every data qubit to which it is joined by a physical connection 450, 455, as well as the gates required for the surface code connecting data qubits to ancilla qubits.

For example, certain labels can be different frequencies in the case of superconducting qubits. Additionally, the physical connections 450, 455 may need to be isolated from one another, being cavities of different frequencies, for example.

Two cavity labels are sufficient, and have been indicated by the two types of physical connections 450, 455 throughout the examples herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A device lattice arrangement, comprising:
   a plurality of devices;
   a plurality of physical connections for the plurality of devices, wherein each of the plurality of devices are coupled to at most two of the plurality of physical connections;
   a plurality of identity labels associated with individual devices of the plurality of devices; and
   an arrangement of identity labels such that pairs of devices of the plurality of devices connected by some number of the plurality of connections have different identity labels;
   wherein a four data device group of the plurality of devices are arranged in a trapezoidal shape such that at most two of the plurality of physical connections are coupled to any one data device in the four data device group of the plurality of devices; and
   wherein one ancilla device is positioned in a middle of the trapezoidal shape to measure a parity of the four data device group of the plurality of devices.

2. The arrangement as claimed in claim 1 wherein each of the plurality of devices are controllably coupled to other devices of the plurality of devices along a physical connection of the plurality of physical connections.

3. The arrangement as claimed in claim 1 wherein each device of the plurality of devices is controllably coupled to other devices of the plurality of devices along a physical connection provided by devices of the plurality of devices having different identity labels.

4. The arrangement as claimed in claim 1 wherein a first subgroup of the plurality of devices is data devices.

5. The arrangement as claimed in claim 4 wherein a second subgroup of the plurality of devices is ancilla devices.

6. The arrangement as claimed in claim 5 wherein each of the plurality of data devices are controllably coupled to a neighboring group of the ancilla devices.

7. The arrangement as claimed in claim 1 wherein each identity label is unique from other identity labels.

8. The arrangement as claimed in claim 1 wherein a total number of identity labels are five.

9. The arrangement as claimed in claim 1 wherein a total number of identity labels are eight.

10. The arrangement as claimed in claim 1 wherein a total number of identity labels are nine.

11. The arrangement as claimed in claim 1 and wherein the identity label is a superconducting qubit frequency.

12. The arrangement as claimed in claim 1 and wherein the device is a qubit.

13. The arrangement as claimed in claim 1 wherein the device is a superconducting qubit.

14. The arrangement of claim 6 wherein the data and ancilla devices wherein the plurality of data qubits and the plurality of ancilla qubits are arranged as a skew-square lattice.

15. The arrangement of claim 6 wherein the plurality of data devices and the plurality of ancilla devices are arranged as a square lattice.

16. The arrangement and arrangements as claimed in claim 6 wherein the coupling between devices is a two-qubit entangling operation.

17. The arrangement as claimed in claim 16 wherein the two-qubit entangling operation is a controlled-NOT.

18. A superconducting qubit surface code system, comprising:
    a first plurality of superconducting qubits;
    a second plurality of superconducting qubits; and
    a plurality of resonators coupling the first and second plurality of superconducting qubits, wherein each of the plurality of first and second plurality of superconducting qubits includes an identity label;
    wherein a four data device group of the first plurality of devices are arranged in a trapezoidal shape such that at most two of the plurality of resonators are coupled to any one data device in the four data device group of the first plurality of devices; and
    wherein one ancilla device is positioned in a middle of the trapezoidal shape to measure a parity of the four data device group of the first plurality of devices.

19. The system as claimed in claim 18 wherein the first and second plurality of superconducting qubits is mapped as a surface code onto a lattice.

20. The system as claimed in claim 18 wherein the identity label is a superconducting qubit frequency.

21. The system as claimed in claim 20 wherein there are five distinct superconducting qubit frequencies.

22. The system as claimed in claim 20 wherein there are eight distinct superconducting qubit frequencies.

23. The system as claimed in claim 20 wherein there are nine distinct superconducting qubit frequencies.

24. The system as claimed in claim 20 wherein the coupling between superconducting qubits is a two-qubit entangling operation.

25. The system as claimed in claim 24 wherein the two-qubit entangling operation is the controlled-NOT.

* * * * *